(12) United States Patent
Seon

(10) Patent No.: US 9,190,828 B2
(45) Date of Patent: Nov. 17, 2015

(54) DETECTING CIRCUIT FOR CIRCUIT BREAKER

(71) Applicant: LSIS CO., LTD., Anyang-si, Gyeonggi-do (KR)

(72) Inventor: Jong Kug Seon, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 59 days.

(21) Appl. No.: 14/281,417

(22) Filed: May 19, 2014

(65) Prior Publication Data

US 2014/0354288 A1    Dec. 4, 2014

(30) Foreign Application Priority Data

Jun. 3, 2013 (KR) ........................ 10-2013-0063592

(51) Int. Cl.
*G01R 31/02*    (2006.01)
*H02H 3/08*    (2006.01)
*G01R 19/02*    (2006.01)
*G01R 19/04*    (2006.01)

(52) U.S. Cl.
CPC .................. *H02H 3/08* (2013.01); *G01R 19/02* (2013.01); *G01R 19/04* (2013.01)

(58) Field of Classification Search
CPC ........................................... H02H 3/08–3/105
USPC ........................................................ 324/424
See application file for complete search history.

(56) References Cited

U.S. PATENT DOCUMENTS

| 4,945,445 A | 7/1990 | Schmerda et al. | |
| 2002/0075613 A1* | 6/2002 | Mason, Jr. ........... | H02H 1/0015 361/42 |
| 2006/0125543 A1* | 6/2006 | Hsieh .................. | H03F 3/45973 327/307 |

(Continued)

FOREIGN PATENT DOCUMENTS

| EP | 2184827 | 5/2010 |
| JP | 3384277 | 3/2003 |

(Continued)

OTHER PUBLICATIONS

Korean Intellectual Property Office Application Serial No. 10-2013-0063592, Office Action dated Apr. 30, 2014, 3 pages.

(Continued)

*Primary Examiner* — Patrick Assouad
*Assistant Examiner* — Demetrius Pretlow
(74) *Attorney, Agent, or Firm* — Lee, Hong, Degerman, Kang & Waimey

(57) ABSTRACT

The present disclosure relates to a detecting circuit for a circuit breaker, comprises: a detection sensor configured to output a detection signal by detecting a voltage or a current on an alternating current electric power circuit; a low pass filter configured to output a signal from the detection sensor after removing a high frequency component from the signal; an offset remover configured to output a signal from the low pass filter after removing a direct current offset from the signal; an amplifier configured to amplify a signal from the offset remover, and to output the signal; and a comparator configured to output a breaking control signal such that the circuit breaker operates to a circuit breaking position, if the detection signal input to the amplifier is equal to or larger than a reference voltage.

6 Claims, 4 Drawing Sheets

(56) References Cited

U.S. PATENT DOCUMENTS

| | | | | |
|---|---|---|---|---|
| 2010/0296220 | A1* | 11/2010 | Seon | H02H 3/33 361/115 |
| 2011/0109306 | A1* | 5/2011 | Leeb | G01R 33/12 324/228 |

FOREIGN PATENT DOCUMENTS

| | | |
|---|---|---|
| JP | 3847286 | 11/2006 |
| JP | 2008-166277 | 7/2008 |
| KR | 10-0567815 | 4/2006 |
| KR | 10-0760331 | 9/2007 |

OTHER PUBLICATIONS

European Patent Office Application Serial No. 14168642.8, Search Report dated Oct. 20, 2014, 7 pages.

Korean Intellectual Property Office Application Serial. No. 10-2013-0063592, Notice of Allowance dated Dec. 12, 2014, 2 pages.

Japan Patent Office Application Serial No. 2014-111201, Office Action dated Mar. 5, 2015, 2 pages.

* cited by examiner

DETECTING CIRCUIT FOR CIRCUIT BREAKER

CROSS-REFERENCE TO RELATED APPLICATION

Pursuant to 35 U.S.C. §119(a), this application claims the benefit of earlier filing date and right of priority to Korean Application No. 10-2013-0063592, filed on Jun. 3, 2013, the contents of which are all hereby incorporated by reference herein in its entirety.

BACKGROUND OF THE DISCLOSURE

1. Field of the Disclosure

The present disclosure relates to a circuit breaker, and particularly, to a circuit breaker capable of precisely determining a size of a target alternating current (abbreviated as AC hereinafter) component, even if a voltage detection signal or a current detection signal includes noise.

2. Background of the Disclosure

A detecting circuit for a circuit breaker in accordance with the related art will be explained with reference to FIGS. 1 to 3.

FIG. 1 is a block diagram illustrating a configuration of a detecting circuit for a circuit breaker in accordance with the related art. As shown in FIG. 1, the detecting circuit for a circuit breaker includes a detection sensor 20 configured to detect a voltage or a current on an AC circuit; a peak level detector 21 connected to an output terminal of the detection sensor 20, and configured to detect a peak level of a voltage detection signal on the AC circuit or a current detection signal on the AC circuit output from the detection sensor 20; and a comparator 22 connected to an output terminal of the peak level detector 21, and configured to compare an output signal from the peak level detector 21 with a reference voltage.

As shown in FIG. 2, a wave of voltage detection signal (Va) or a current detection signal, which is detected from an AC circuit by the detection sensor 20, shows a waveform which fluctuates up and down based on a Root Mean Square (abbreviated as RMS hereinafter) value wave (Vrms), due to noise included therein.

A peak level of the detection signal (Va) is extracted by the peak level detector 21 of a next stage.

Then the peak level of the detection signal is compared with a reference voltage by the comparator 22 of a next stage. If the peak level of the detection signal is equal to or larger than the reference voltage, the comparator 22 outputs a signal of a high level. The output signal of a high level (Vout) has a waveform shown in FIG. 3.

A circuit breaker 10 of FIG. 1 operates to a breaking position ('trip' position), by the signal of a high level, which is output from the comparator 22.

However, the conventional detecting circuit for a circuit breaker may have the following problems.

Firstly, the detection signal (Va) shown in FIG. 2, which has been distorted due to harmonic noise such as switching noise from a diode or a transistor, is compared with a reference voltage of the comparator 22. Then the compared signal is output as an output signal (Vout) shown in FIG. 3. This may cause a malfunction of the circuit breaker 10.

SUMMARY OF THE DISCLOSURE

Therefore, an object of the detailed description is to provide a detecting circuit for a circuit breaker, capable of precisely detecting a current or a voltage on a circuit even if a voltage detection signal or a current detection signal includes noise.

To achieve these and other advantages and in accordance with the purpose of this disclosure, as embodied and broadly described herein, there is provided a detecting circuit for a circuit breaker, comprising:

a detection sensor configured to output a detection signal by detecting a voltage or a current on an alternating current electric power circuit;

a low pass filter connected to an output terminal of the detection sensor, and configured to output a signal from the detection sensor after removing a high frequency component from the signal from the detection sensor;

an offset remover connected to an output terminal of the low pass filter, and configured to output a signal from the low pass filter after removing a direct current offset from the signal;

an amplifier connected to an output terminal of the offset remover, and configured to amplify a signal from the offset remover and to output the signal;

a comparator configured to output a breaking control signal such that the circuit breaker operates to a circuit breaking position, if the detection signal input to the amplifier is equal to or larger than a reference voltage; and a sampling circuit connected to an output terminal of the amplifier, and configured to output a signal in a sampling manner from an output signal from the amplifier, at predetermined frequency intervals.

According to an aspect of the present invention, the detecting circuit for a circuit breaker may further comprise a Root Mean Square (RMS) detector connected to an output terminal of the LPF in parallel to the offset remover, and configured to output an RMS of an output signal from the LPF.

According to another aspect of the present invention, the detecting circuit for a circuit breaker may further comprise a reference voltage detector connected to an output terminal of the RMS detector and an output terminal of the offset remover, and configured to output a signal of a high level based on an output signal from the RMS detector and an output signal from the offset remover, for a time duration when an output signal from the offset remover is larger than an output signal from the RMS detector.

According to another aspect of the present invention, the detecting circuit for a circuit breaker may further comprise a signal divider connected to an output terminal of the reference voltage detector, and an output terminal of the sampling circuit, and configured to extract a frequency component signal from an output signal from the sampling circuit, and configured to output a signal of a target frequency, based on a pulse width and a period of the extracted frequency component signal.

According to another aspect of the present invention, the comparator may be connected to an output terminal of the reference voltage detector and an output terminal of the signal divider, and may be configured to output a breaking control signal such that the circuit breaker operates to a circuit breaking position, if an output signal from the signal divider is equal to or larger than an output signal from the reference voltage detector.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this disclosure, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a configuration and an operation of a detecting circuit for a circuit breaker according to an embodiment of the present invention will be explained with reference to FIGS. 4 to 8.

Figure 1:
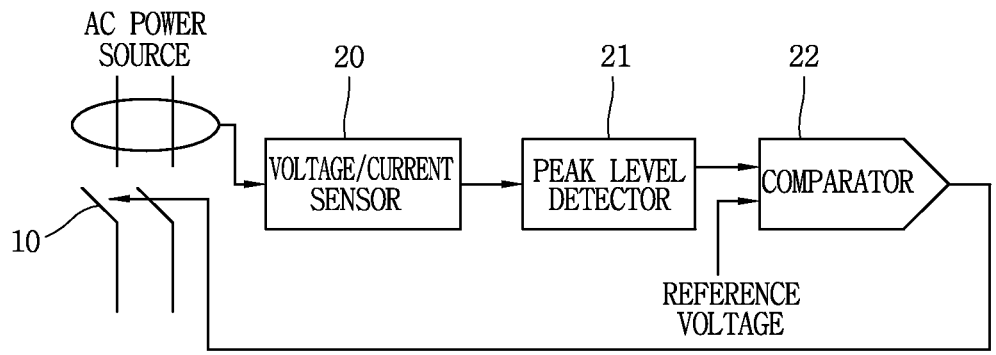
FIG. 1 is a block diagram illustrating a configuration of a detecting circuit for a circuit breaker in accordance with the conventional art.
Figure 2:
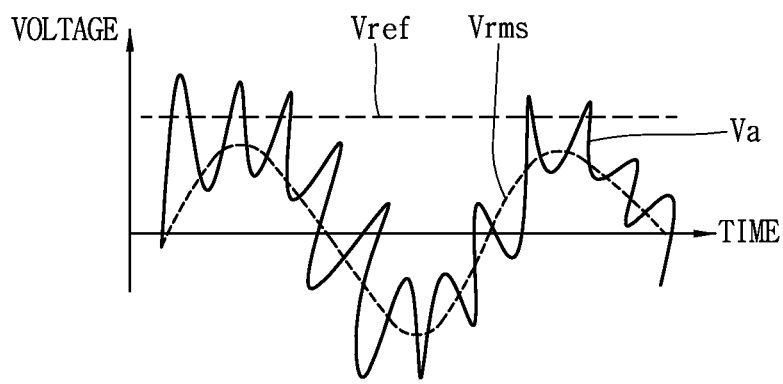
FIG. 2 is a view illustrating a waveform of a voltage detection signal or a current detection signal detected by the detecting circuit of FIG. 1, a waveform of a Root Mean Square (RMS) of the voltage detection signal or the current detection signal, and a waveform of a reference voltage.
Figure 3:
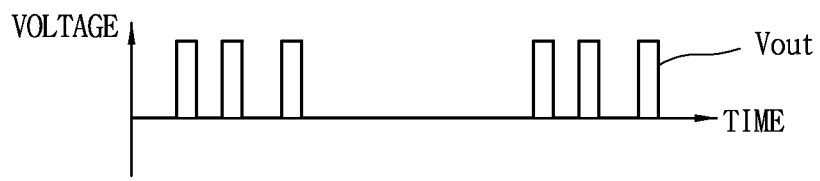
FIG. 3 is a view illustrating a waveform output from a comparator of FIG. 1.
Figure 4:
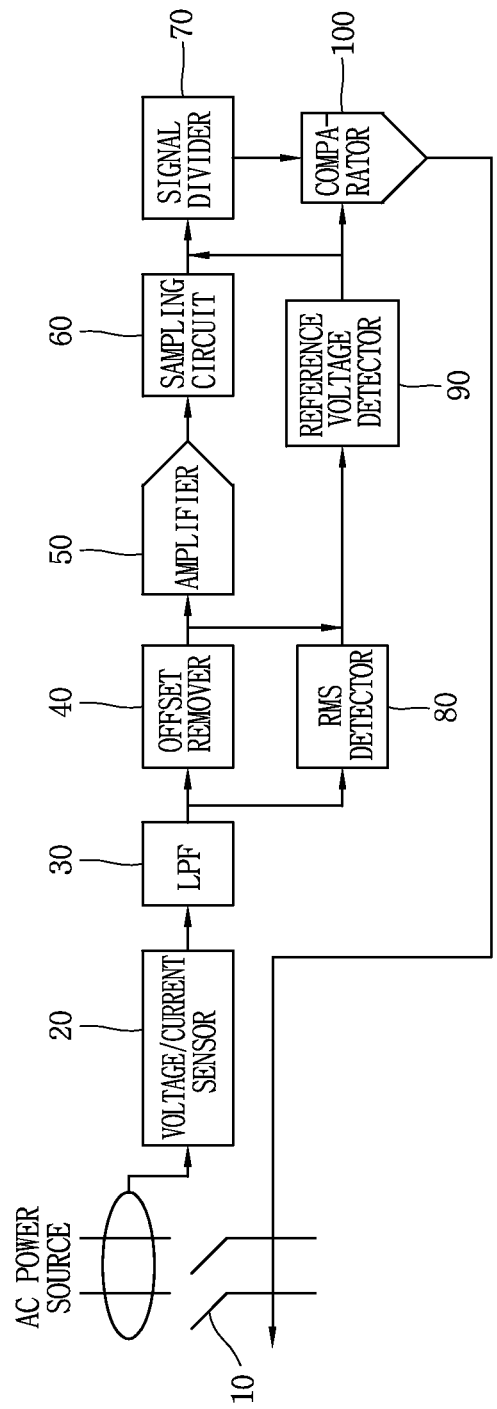
FIG. 4 is a block diagram illustrating a configuration of a detecting circuit for a circuit breaker according to an embodiment of the present invention.

Referring to FIG. 4, a circuit breaker 10 includes a molded-case circuit beaker, an earth leakage breaker, an air circuit breaker, a vacuum circuit breaker, etc.

As shown in FIG. 4, a detecting circuit for a circuit breaker according to an embodiment of the present invention includes a detection sensor 20, a low pass filter (abbreviated as LPF hereinafter) 30, an offset remover 40, an amplifier 50 and a comparator 100.

The detection sensors 20 are configured by a potential transformer and a current transformer, and are configured to detect a voltage or a current on an alternating current electric power circuit to thus output a detection signal.

The LPF 30 is connected to an output terminal of the detection sensor 20. The LPF 30 is configured to output a signal from the detection sensor 20 after removing a high frequency component from the signal.

The offset remover 40 is connected to an output terminal of the LPF 30, and is configured to output a signal from the LPF 30 after removing a direct current offset, i.e., a direct current component rather than an alternating current (abbreviated as AC hereinafter) component of 60 Hertz (abbreviated as Hz hereinafter). Such offset remover 40 may be configured as a coupling capacitor for blocking a direct current component and passing only a frequency component to a next stage.

The amplifier 50 is connected to an output terminal of the offset remover 40, and is configured to amplify a signal from the offset remover 40 and to output the signal.

If the detection signal input to the amplifier 50 is not smaller than a reference voltage (in other words is larger than or equal to a reference voltage), the comparator 100 outputs a breaking control signal so that the circuit breaker 10 can be operated to a circuit breaking position (i.e., trip position).

The detecting circuit for a circuit breaker according to a preferred embodiment of the present invention may further include a sampling circuit 60.

The sampling circuit 60 is connected to an output terminal of the amplifier 50, and is configured to sample and output an output signal from the amplifier 50 at predetermined frequency intervals.

The detecting circuit for a circuit breaker according to a preferred embodiment of the present invention may further include an Root Mean Square (abbreviated as RMS hereinafter) detector 80.

The RMS detector 80 is connected to an output terminal of the LPF 30, in parallel to the offset remover 40. The RMS detector 80 is configured to output a Root Mean Square (RMS) signal of an output signal from the LPF 30.

Figure 5:
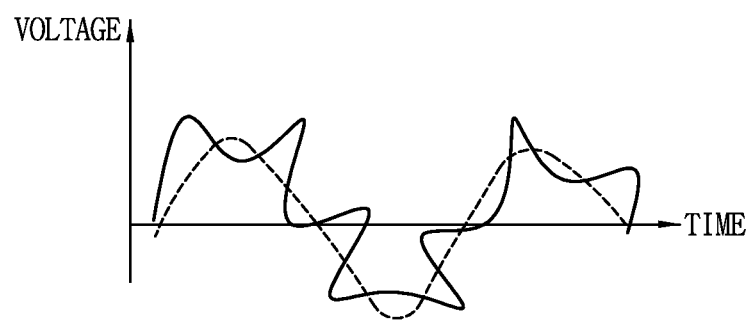
FIG. 5 is a view illustrating waveforms of an output signal from an offset remover circuit and an output signal from a Root Mean Square (RMS) detector in a detecting circuit for a circuit breaker according to an embodiment of the present invention.

Referring to FIG. 5, in a case where an output signal from the offset remover 40, from which a direct current component has been removed, has a waveform indicated by a solid line, an output signal from the RMS detector 80 has an AC waveform, a sine wave indicated by a dotted line.

The detecting circuit for a circuit breaker according to a preferred embodiment of the present invention may further include a reference voltage detector 90.

The reference voltage detector 90 is connected to an output terminal of the RMS detector 80 and an output terminal of the offset remover 40, and outputs a signal of a high level based on an output signal from the RMS detector 80 and an output signal from the offset remover 40. In this case, the reference voltage detector 90 outputs the output signal for a time duration when an output signal from the offset remover 40 is larger than an output signal from the RMS detector 80.

Figure 6:
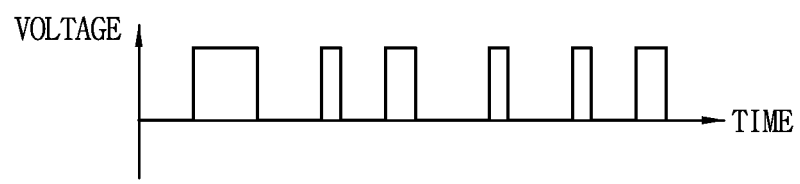
FIG. 6 is a view illustrating a waveform of an output signal from a reference voltage detector in a detecting circuit for a circuit breaker according to an embodiment of the present invention.

In the case where an output signal from the offset remover 40 has a waveform indicated by a solid line and an output signal from the RMS detector 80 has a sine wave indicated by a dotted line as shown in FIG. 5, an output signal from the reference voltage detector 90 has a square waveform of FIG. 6. The square wave becomes a high level for a time duration when an output signal from the offset remover 40 is larger than an output signal from the RMS detector 80.

The detecting circuit for a circuit breaker according to a preferred embodiment of the present invention may further include a signal divider (in other words signal classifier) 70.

The signal divider 70 is connected to an output terminal of the reference voltage detector 90, and an output terminal of a sampling circuit 60. The signal divider 70 extracts a frequency component signal from an output signal from the sampling circuit 60. Then the signal divider 70 outputs a signal of a target frequency, based on a pulse width and a period of the extracted frequency component signal.

That is, the signal divider 70 may extract frequency component signals each having a period, from an output signal from the sampling circuit 60. Among the extracted frequency component signals, a target frequency component signal, e.g., a frequency component signal having a narrow pulse width and a frequency of a commercial alternating current (i.e., 60 Hz) is extracted.

Figure 7:
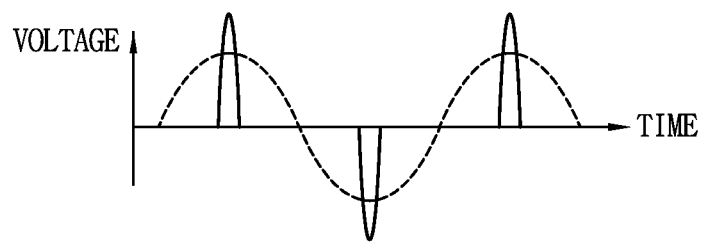
FIG. 7 is a view illustrating waveforms of an output signal from an offset remover and an output signal from an RMS detector, with respect to a detection signal of a target frequency in a detecting circuit for a circuit breaker according to an embodiment of the present invention.

In a case where the extracted frequency component signal has a target frequency, the output signal from the offset remover 40 has a constant period, a waveform indicated by the solid line of FIG. 7.

Figure 8:
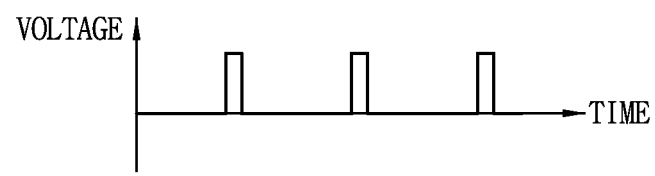
FIG. 8 is a view illustrating a waveform of an output signal from a reference voltage detector, according to an output signal from an offset remover and an output signal from an RMS detector, with respect to a detection signal of a target frequency in a detecting circuit for a circuit breaker according to an embodiment of the present invention.

The reference voltage detector 90 may output a signal having a constant period, as indicated by a pulse waveform of FIG. 8, after comparing the output signal from the offset remover 40 with the output signal from the RMS detector 80.

In the present invention, the comparator 100 is connected to an output terminal of the reference voltage detector 90 and an output terminal of the signal divider 70. If an output signal from the signal divider 70 is not smaller than output signal from the reference voltage detector 90 (in other words is larger than or equal to output signal from the reference voltage detector 90), the comparator 100 outputs a breaking control signal so that the circuit breaker 10 can be operated to a circuit breaking position.

As is well known, the circuit breaker 10, especially, a trip mechanism (not shown) included in the circuit breaker 10, is configured as an electromagnetic device having a coil and an armature. The trip mechanism triggers a switching mechanism (not shown) in response to the breaking control signal, so that a trip spring can be moved from a restricting position in a charged state of elastic energy, to a trip position in a released state of elastic energy so as to discharge the charged elastic energy as a trip driving force. Under such configuration, if the switching mechanism provides a trip driving force, a movable contact arm (not shown) is separated from a stationary contact arm (not shown) of the circuit breaker. As a result, the earth leaked circuit is broken.

An operation of the detecting circuit for a circuit breaker according to the present invention will be explained in more detail with reference to FIGS. 4 to 8.

Firstly, the detection sensor 20 detects a voltage or a current on an AC circuit, thereby outputting a detection signal.

In order to obtain a commercial AC signal of target 60 Hz, a high frequency noise signal is removed from the detection signal. More specifically, the LPF 30 removes a high frequency component from the detection signal output from the detection sensor 20, and outputs a signal. The output signal from the LPF 30 also has frequency components adjacent to the target 60 Hz, i.e., 120 Hz, 180 Hz and 240 Hz.

The offset remover 40 removes a direct current offset, i.e., a direct current component rather than a target alternating current component, from the output is signal from the LPF 30. Then the offset remover 40 outputs a signal.

The RMS detector 80, which is connected to an output terminal of the LPF 30 in parallel to the offset remover 40, outputs a Root Mean Square (RMS) signal of the output signal from the LPF 30. Accordingly, a sine AC signal, indicated by a dotted line shown in FIG. 5 or FIG. 7, can be obtained.

Then the output signal from the offset remover 40 is amplified by the amplifier 50.

As shown in FIG. 6, the reference voltage detector 90 outputs a signal of a high level for a time duration when an output signal from the offset remover 40 is larger than an output signal from the RMS detector 80. As a result, an output signal of a square wave is obtained.

The sampling circuit 60 samples an output signal from the amplifier 50 and outputs a signal at predetermined frequency intervals.

The signal divider 70 extracts a frequency component signal from an output signal from the sampling circuit 60. Then the signal divider 70 outputs a signal of a target frequency, based on a pulse width and a period of the extracted frequency component signal.

If the output signal from the signal divider 70 is equal to or larger than the output signal from the reference voltage detector 90, the comparator 100 outputs a breaking control signal so that the circuit breaker 10 can operate to a circuit breaking position.

As is well known, the circuit breaker 10, especially, a trip mechanism (not is shown) included in the circuit breaker 10, triggers a switching mechanism (not shown) to a trip position in response to the breaking control signal. As the switching mechanism provides a trip driving force, a movable contact arm (not shown) of the circuit breaker 10 is separated from a fixed contact arm (not shown). As a result, a circuit, on which an abnormal current, such as an over current, a short circuit current and a leakage current, has occurred, is broken so that a load side circuit and a load device can be protected.

As aforementioned, in the detecting circuit for a circuit breaker according to the present invention, a target size of an alternating current component can be precisely determined, even if a detection voltage signal or a detection current signal includes noise. This can minimize a malfunction of the circuit breaker, and can enhance an operational reliability of the circuit breaker.

The detecting circuit for a circuit breaker according to the present invention can have the following advantages.

Firstly, the detecting circuit for a circuit breaker according to the present invention includes the LPF. Accordingly, an unnecessary high frequency noise signal can be removed from a current detection signal or a voltage detection signal.

Secondly, the detecting circuit for a circuit breaker according to the present invention includes the offset remover. Accordingly, a direct current noise component which may be included in a detection signal can be removed.

Thirdly, the detecting circuit for a circuit breaker according to the present invention includes the RMS detector. Accordingly, a RMS signal of a current is detection signal or a voltage detection signal can be output.

Fourthly, the detecting circuit for a circuit breaker according to the present invention includes the reference voltage detector connected to an output terminal of the RMS detector and an output terminal of the offset remover, and configured to output a signal of a high level for a time duration when an output signal from the offset remover is larger than an output signal from the RMS detector. Accordingly, a reference voltage signal can be output at a time section where it is larger than an RMS of a detection signal from which a direct current noise component has been removed.

Fifthly, the detecting circuit for a circuit breaker according to the present invention includes the sampling circuit connected to an output terminal of the amplifier. Accordingly, a signal can be output in a sampling manner from an output signal from the amplifier, at predetermined frequency intervals.

Sixthly, the detecting circuit for a circuit breaker according to the present invention includes the signal divider connected to an output terminal of the reference voltage detector and an output terminal of the sampling circuit, and configured to receive input signals from the output terminals. Accordingly, a frequency component signal having a period is extracted from an output signal from the sampling circuit. Further, a signal of a target frequency can be output based on a pulse width and a period of the extracted frequency component signal.

Seventhly, the detecting circuit for a circuit breaker according to the present invention includes the comparator connected to an output terminal of the is reference voltage detector and an output terminal of the signal divider, and configured to receive input signals from the output terminals. Accordingly, if an output signal from the signal divider is equal to or larger than an output signal from the reference voltage detector, a breaking control signal can be output so that the circuit breaker can be moved to a circuit breaking position.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A detecting circuit for a circuit breaker, comprising:
   a detection sensor configured to output a detection signal by detecting a voltage or a current on an alternating current electric power circuit;
   a low pass filter connected to an output terminal of the detection sensor, and configured to output a signal from the detection sensor after removing a high frequency component from the signal from the detection sensor;
   an offset remover connected to an output terminal of the low pass filter, and configured to output a signal from the low pass filter after removing a direct current offset from the signal;
   an amplifier connected to an output terminal of the offset remover, and configured to amplify a signal from the offset remover and to output the signal;
   a comparator configured to output a breaking control signal such that the is circuit breaker operates to a circuit breaking position, if the detection signal input to the amplifier is equal to or larger than a reference voltage; and
   a sampling circuit connected to an output terminal of the amplifier, and configured to output a signal in a sampling manner from an output signal from the amplifier, at predetermined frequency intervals.

2. The detecting circuit for a circuit breaker of claim 1, wherein the offset remover is configured as a coupling capacitor for blocking a direct current component and passing only a frequency component to a next stage.

3. The detecting circuit for a circuit breaker of claim 1, further comprising a Root Mean Square detector connected to an output terminal of the low pass filter in parallel to the offset remover, and configured to output an Root Mean Square signal of an output signal from the low pass filter.

4. The detecting circuit for a circuit breaker of claim 3, further comprising a reference voltage detector connected to an output terminal of the Root Mean Square detector and an output terminal of the offset remover, and configured to output a signal of a high level based on an output signal from the Root Mean Square detector and an output signal from the offset remover, for a time duration when an output signal from the offset remover is larger than an output signal from the Root Mean Square detector.

5. The detecting circuit for a circuit breaker of claim 4, further comprising a signal divider connected to an output terminal of the reference voltage detector and an output terminal of the sampling circuit, and configured to extract a frequency component signal from an output signal from the sampling circuit, and configured to output a signal of a target frequency, based on a pulse width and a period of the extracted frequency component signal.

6. The detecting circuit for a circuit breaker of claim 5, wherein the comparator is connected to an output terminal of the reference voltage detector and an output terminal of the signal divider, and is configured to output a breaking control signal such that the circuit breaker operates to a circuit breaking position, if an output signal from the signal divider is equal to or larger than an output signal from the reference voltage detector.

* * * * *